United States Patent
Richt et al.

(10) Patent No.: US 8,476,985 B2
(45) Date of Patent: Jul. 2, 2013

(54) METHOD AND ARRANGEMENT FOR GENERATING A FREQUENCY-MODULATED SIGNAL

(75) Inventors: Norbert Richt, Markt Schwaben (DE); Petr Lorenz, Lenggries (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 207 days.

(21) Appl. No.: 12/516,247

(22) PCT Filed: Jun. 10, 2008

(86) PCT No.: PCT/EP2008/004630
§ 371 (c)(1), (2), (4) Date: May 26, 2009

(87) PCT Pub. No.: WO2009/018871
PCT Pub. Date: Feb. 12, 2009

(65) Prior Publication Data
US 2010/0301960 A1    Dec. 2, 2010

(30) Foreign Application Priority Data

Aug. 6, 2007   (DE) .................. 10 2007 036 982
Nov. 21, 2007  (DE) .................. 10 2007 055 529

(51) Int. Cl.
*H04L 27/20*   (2006.01)

(52) U.S. Cl.
USPC ........... 332/103; 332/120; 332/145; 332/149; 455/73; 455/76; 455/86; 455/118

(58) Field of Classification Search
USPC .................... 332/103, 120, 145, 149; 445/73, 445/76, 86, 118
See application file for complete search history.

(56) References Cited

U.S. PATENT DOCUMENTS

| | | | |
|---|---|---|---|
| 3,517,338 A | 6/1970 | Herman et al. | |
| 3,961,262 A * | 6/1976 | Gassmann | 455/207 |
| 4,593,410 A * | 6/1986 | Kyrian | 455/109 |
| 5,224,119 A | 6/1993 | Barabash et al. | |
| 5,303,417 A * | 4/1994 | Laws | 455/314 |

(Continued)

FOREIGN PATENT DOCUMENTS

| | | |
|---|---|---|
| DE | 20051 | 10/1960 |
| DE | 4302456 A1 | 8/1994 |

(Continued)

OTHER PUBLICATIONS

International Search Report, WO 2009/018871 A1, Oct. 14, 2008, pp. 15-20.

(Continued)

*Primary Examiner* — Arnold Kinkead
*Assistant Examiner* — Richard Tan
(74) *Attorney, Agent, or Firm* — Ditthavong Mori & Steiner P.C.

(57) ABSTRACT

In order to generate a broadband, frequency-modulated output signal, of which the carrier frequency is adjustable within a wide frequency range, a frequency-modulated signal is generated on an arbitrary, fixed carrier frequency, which is then converted into IQ signals, and the IQ signals generated in this manner are combined with the desired carrier frequency by IQ modulation to form the frequency-modulated output signal. By preference, the generated IQ signals are low-pass filtered before the IQ modulation.

15 Claims, 2 Drawing Sheets

U.S. PATENT DOCUMENTS

| | | | |
|---|---|---|---|
| 5,787,362 A | 7/1998 | Matero | |
| 5,894,249 A | 4/1999 | Kuwabara | |
| 6,844,787 B2 * | 1/2005 | Vann et al. | 332/103 |
| 7,107,022 B1 | 9/2006 | Thomas et al. | |
| 7,324,798 B2 * | 1/2008 | Seo et al. | 455/324 |
| 7,386,287 B2 * | 6/2008 | Jenkins et al. | 455/232.1 |
| 7,558,189 B2 * | 7/2009 | Yoneya | 370/204 |
| 2003/0129955 A1 | 7/2003 | Gilmore | |
| 2006/0178119 A1 | 8/2006 | Jarvinen | |
| 2007/0202814 A1 * | 8/2007 | Ono et al. | 455/78 |
| 2008/0160947 A1 * | 7/2008 | Xin et al. | 455/247.1 |

FOREIGN PATENT DOCUMENTS

| | | |
|---|---|---|
| DE | 10211381 A1 | 6/2003 |
| GB | 2236225 A | 3/1991 |
| WO | 0167592 A2 | 9/2001 |

OTHER PUBLICATIONS

International Preliminary Report on Patentability, PCT/EP2008/004630, dated Apr. 8, 2010, pp. 1-7.

* cited by examiner

METHOD AND ARRANGEMENT FOR GENERATING A FREQUENCY-MODULATED SIGNAL

CROSS-REFERENCE TO RELATED APPLICATION

The present application claims priority to German Application No. DE 10 2007 036 982.6, filed on Aug. 6, 2007, German Application No. DE 10 2007 055 529.8, filed on Nov. 21, 2007, and PCT Application No. PCT/EP2008/004630, filed Jun. 10, 2008, the entire contents of which are herein incorporated by reference.

BACKGROUND OF THE INVENTION

1. Field of the Invention

The invention relates the generation of a frequency-modulated signal.

2. Discussion of the Background

High-frequency testing technology often uses frequency-modulated output signals, which provide, on the one hand, a relatively-wide frequency deviation (bandwidth) and, on the other hand, a carrier frequency, which is adjustable within a wide frequency range, for example, between 1 GHz and 40 GHz. This is not possible with known frequency-modulatable signal generators; these can achieve maximum frequency deviations of 10-20 MHz dependent upon the properties of the generator. With so-called vectorial, IQ-modulatable microwave generators, a frequency deviation of up to 100 MHz is possible using so-called AWG (arbitrary waveform generator) function generators, for example, according to U.S. Pat. No. 5,224,119, dependent upon the digital/analog converters used. However, a wider frequency deviation is also unattainable with these known arrangements.

SUMMARY OF THE INVENTION

Embodiments of the present invention therefore advantageously provide a method and an arrangement, which can generate a frequency-modulated high-frequency output signal, of which the carrier frequency is arbitrarily adjustable within a wide frequency range, and which can still be generated with an arbitrarily-wide frequency deviation.

An embodiment of a method according to the invention generates a frequency-modulated output signal, for example, at the output of a conventional IQ-modulatable microwave-signal generator, by initially generating, in a known manner on an arbitrary, fixed carrier frequency, a frequency-modulated signal, which is then converted vectorially into corresponding IQ signals, which are finally converted in the IQ-modulatable signal generator with the desired carrier frequency from the broad frequency range to form the frequency-modulated output signal. In this context, the IQ signals initially still influenced by the signal components of the carrier frequency, which are used to generate the frequency-modulated signal, are preferably subjected to a low-pass filtering, and the IQ signals are generated in this manner.

An embodiment of a particularly simple arrangement for the implementation of such a method is specified herein, because every known FM modulator can be used for the generation of the frequency-modulated signal on the arbitrary, fixed carrier frequency. The vectorial signal conversion into the IQ signals, which is, in principle, an IQ demodulation, can be implemented with a conventional IQ demodulator. The generation of the frequency-modulated output signal from these IQ signals can then be effected in a conventional, IQ-modulatable microwave-signal generator.

Accordingly, dependent upon the bandwidth of the IQ modulator, the IQ demodulator and the frequency-modulated signal on the arbitrary, fixed carrier frequency, a frequency-modulated signal of arbitrarily-wide frequency deviation (bandwidth) can be generated on a carrier frequency, for example, between 1 GHz and 44 GHz using a method according to the invention. In this context, the method according to the invention operates in a purely analog manner and accordingly avoids bandwidth-limited digital/analog converters and digital signal processing.

In simpler cases, however, the method according to the invention can also be implemented using digital technology. The method according to the invention is also suitable for additional amplitude modulation, so that, for example, very broad-bandwidth, frequency-modulated signals can be generated with a given envelope curve.

BRIEF DESCRIPTION OF THE DRAWINGS

The invention is explained in greater detail below with reference to a schematic drawing of an exemplary embodiment. The drawings are as follows.

DETAILED DESCRIPTION OF EXEMPLARY EMBODIMENTS OF THE INVENTION

Figure 1:
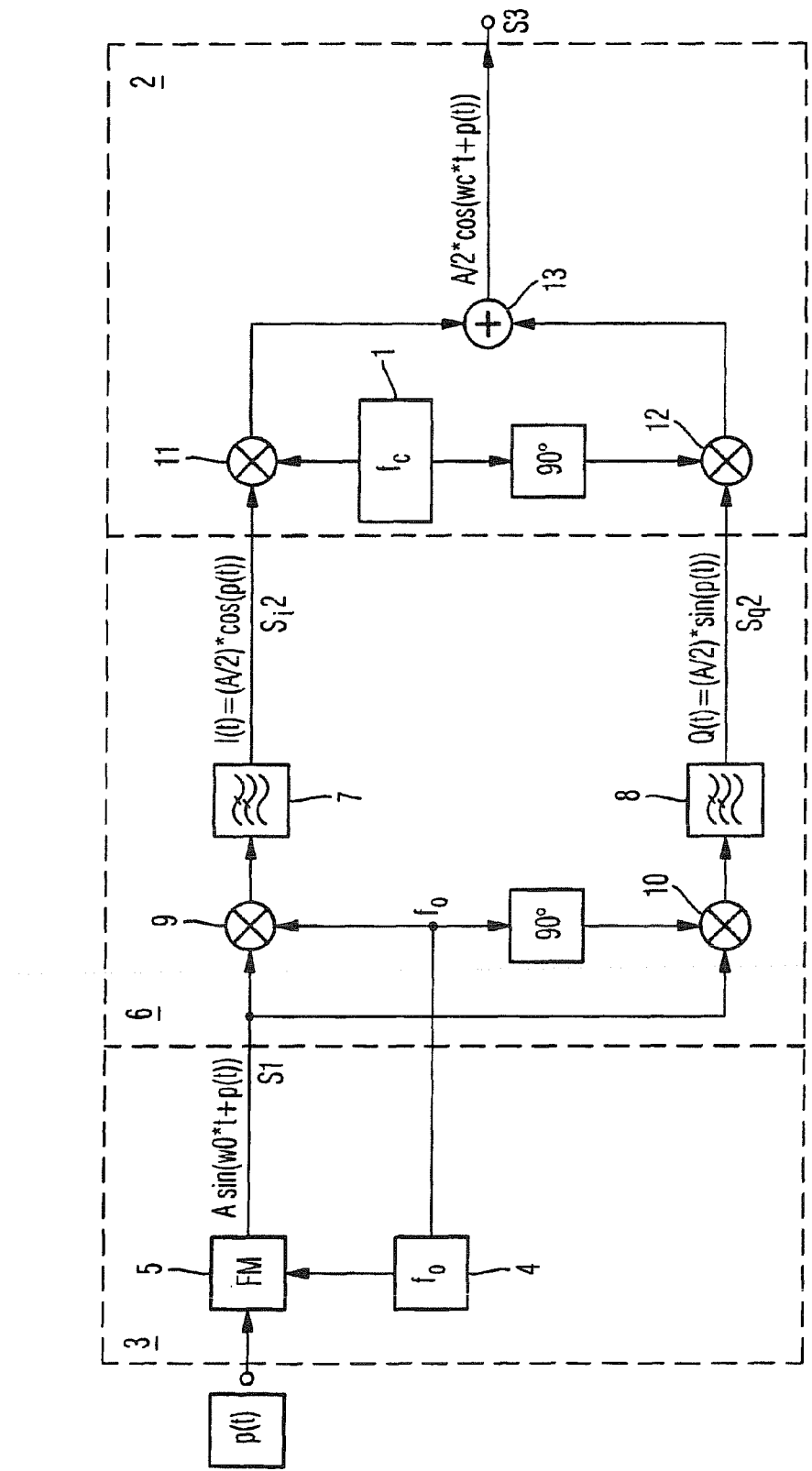
FIG. 1 shows an exemplary embodiment of the arrangement according to the invention.

FIG. 1 shows an arrangement according to the invention for generating a frequency-modulated, high-frequency output signal S3, of which the carrier frequency $f_c$ is adjustable within a wide frequency range with arbitrarily-wide frequency deviation by means of a frequency generator 1 of a conventional IQ signal generator 2. For this purpose, initially in a conventional frequency modulator 3, the modulation signal to be modulated is converted in a modulator 5 with the arbitrary but fixed carrier frequency $f_0$ of an HF generator 4 to form the frequency-modulated signal S1. In a vectorial converter 6 operating in the manner of a conventional IQ demodulator, the signal S1 is converted with the same fixed carrier frequency $f_0$ into the IQ signal components. For this purpose, the IQ signals are generated in a known manner in frequency converters 9 and 10 as an IQ demodulator, on the one hand, with the in-phase component and, on the other hand, with the quadrature phase component rotated through 90°.

In adjacent low-pass filters 7 and 8, the IQ signals $S_i2$ and $S_q2$ are generated. The IQ signals $S_i2$ and $S_q2$ converted in this manner into the baseband are finally supplied to the downstream IQ modulator 2, where they are combined with the selected carrier frequency $f_c$ to form the desired frequency-modulated output signal S3. With the in-phase component and respectively the quadrature-phase component phase-displaced through 90° of the carrier frequency $f_c$, the IQ signals on the carrier frequency $f_c$ are converted by means of the frequency converters 11 and 12, and combined in the summation element 13 to form the frequency-modulated output signal S3.

The frequency modulator 3 is preferably designed in such a manner that, with the fixed frequency $f_0$, it provides the widest possible linear frequency deviation, that is to say, it provides a very broad bandwidth. A VCO (voltage-controlled oscillator) is suitable for this purpose.

With the arrangement described, a frequency-modulated output signal S3 with a carrier frequency $f_c$ is therefore generated from a frequency-modulated signal (FM signal) S1 with a fixed carrier frequency $f_0$ according to the following formulae and, in fact, with a wide frequency deviation, dependent upon the IQ modulator, the IQ demodulator and upon the frequency deviation of the frequency-modulated signal on the arbitrarily-fixed carrier frequency.

A frequency-modulated signal (FM signal) $s_1(t)$ with carrier frequency $f_0$ is given by the equation:

$$s_1(t) = A\sin(w_0 t + p(t)) = A\sin(\phi(t))$$

with the amplitude A, the angular frequency $w_0 = 2\pi f_0$ and the signal p(t), which is given by:

$$p(t) = \int_0^t f(r)dr = F(t) - F(0)$$

with the function $F(t) = \int f(t)dt$.

The momentary angular frequency w(t) is obtained from equations (1) and (2) as follows:

$$w(t) = \frac{d\phi(t)}{dt} = w_0 + \frac{dp(t)}{dt} = w_0 + f(t). \tag{3}$$

In equations (2) and (3), the signal f(t) represents the modulation signal.

When the FM signal (1) is multiplied respectively by $\sin(w_0 t)$ and $\cos(w_0 t)$, the following signals are obtained:

$$s_1(t)\sin(w_0 t) = \frac{A}{2}\cos(p(t)) - \frac{A}{2}\cos(2w_0 t + p(t)) \tag{4a}$$

$$s_1(t)\cos(w_0 t) = \frac{A}{2}\sin(p(t)) + \frac{A}{2}\sin(2w_0 t + p(t)). \tag{4b}$$

The time-dependent I(t) and Q(t) signals are obtained by low-pass filtering of these signals:

$$S_i 2(t) = I(t) = \frac{A}{2}\cos(p(t)) \tag{5a}$$

$$S_q 2(t) = Q(t) = \frac{A}{2}\sin(p(t)). \tag{5b}$$

The IQ-modulated signal $s_{IQ}(t)$ with the carrier frequency $f_c$ is given by:

$$s_{IQ}(t) = \Re((I(t))e^{jw_c t}) = I(t)\cos(w_c t) - Q(t)\sin(w_c t). \tag{6}$$

The following is obtained by inserting the expressions from (5) into this equation:

$$S_3(t) = s_{IQ}(t) = \frac{A}{2}\cos(w_c t + p(t)). \tag{7}$$

Equation (7) describes a frequency-modulated signal with carrier frequency $f_c$.

The method according to embodiments of the invention is particularly suitable for I/Q-modulatable microwave-signal generators, which can be tuned within a broad frequency band, for example, between 1 GHz and 44 GHz. According to embodiments of the method of the invention, a generator of this kind can be used very simply for the generation of a frequency-modulated output signal by connecting upstream only a corresponding frequency modulator with fixed carrier frequency and adjacent, conventional IQ demodulator.

Figure 2:
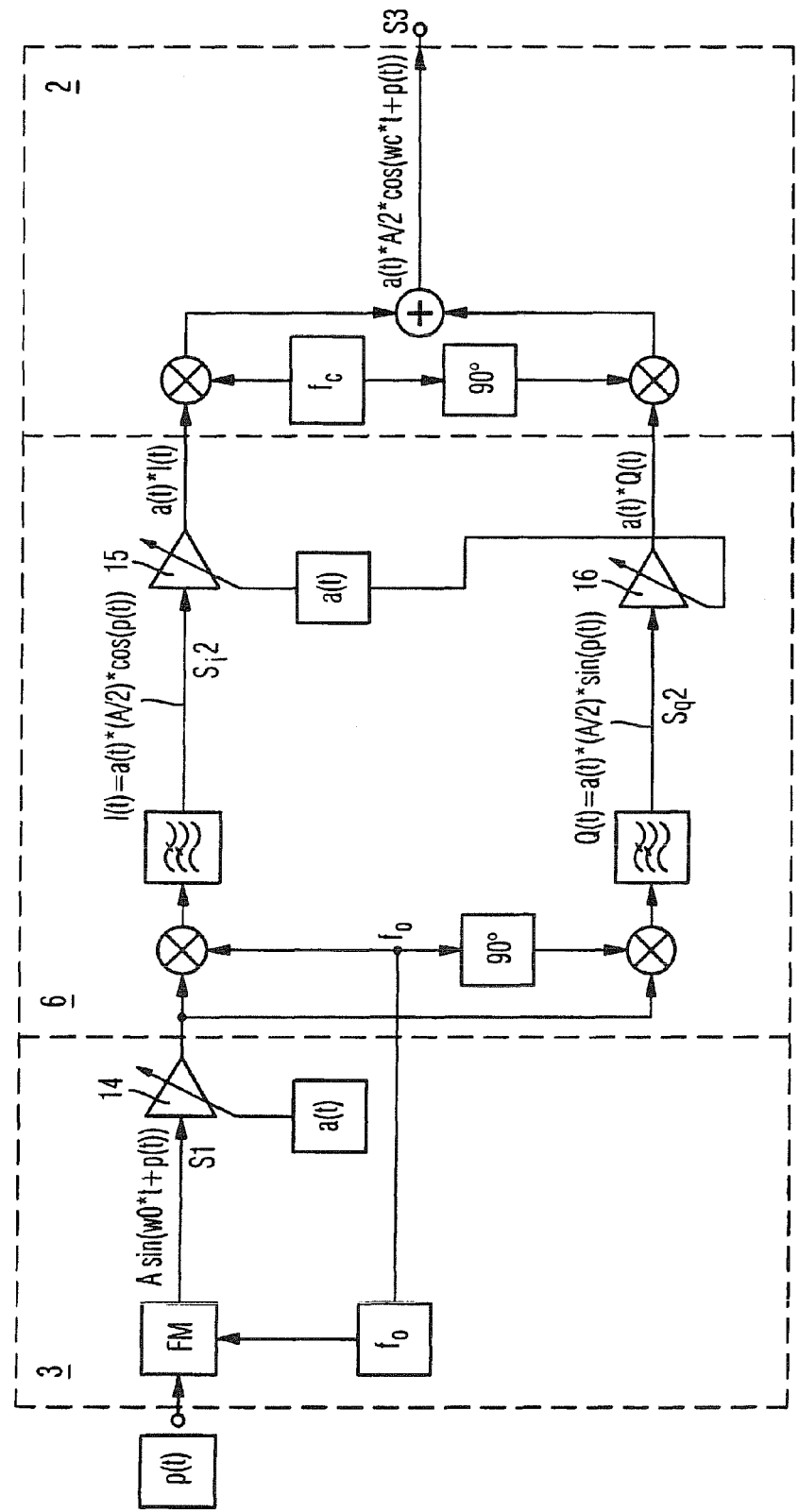
FIG. 2 shows two possibilities for an additional AM modulation.

FIG. 2 shows two possibilities for the additional amplitude modulation of the broadband frequency-modulated output signal S3. The basic circuit for the generation of the frequency-modulated output signal corresponds to FIG. 1. A first possibility for the additional amplitude modulation, for example, as required for frequency-modulated signals with a given envelope curve, consists in modulating, by means of an additional amplitude modulator 14 upstream of the converter 6, the amplitude of the frequency-modulated signal S1 generated on a fixed carrier frequency with the amplitude-modulation signal a(t) corresponding, for example, to the envelope curve. The amplitudes of the I and Q signals $S_i 2$ and $S_q 2$ subsequently generated in the converter 6 are accordingly multiplied by the signal a(t). With this method, the amplitude modulation is implemented within the frequency range of the frequency-modulated signal S1.

The two amplitude modulators 15 and 16 provide another possibility for the additional amplitude modulation, the advantage of which is that the amplitude modulation of the I/Q signals is effected in the baseband. The two amplitude modulators 15 and 16 are arranged respectively within the converter 6 immediately downstream of the low-pass filters 7, 8 in the I and respectively Q branch, and are once again driven with the amplitude-modulation signal a(t).

In the two examples, controllable amplifiers are presented in each case as amplitude modulators; however, other amplitude modulators, such as controllable attenuation elements or similar can also be used.

The invention is not restricted to the exemplary embodiment described. All of the technical and/or illustrated features can be combined with one another as required within the framework of the invention.

The invention claimed is:

1. A method, comprising:
generating a frequency-modulated signal from an input signal using a frequency modulator, wherein the frequency-modulated signal is with a first carrier of an arbitrary fixed carrier frequency and wherein said first carrier is generated using an RF generator operating at said arbitrary fixed carrier frequency;
vectorially converting the frequency-modulated signal into IQ signals, said conversion comprising demodulating the frequency-modulated signal using an IQ demodulator driven by the same RF generator,
wherein circuit path of the frequency-modulated signal is separate from the circuit path from the RF generator to the IQ demodulator; and
combining the IQ signals with a second carrier of a desired carrier frequency through IQ modulation to form a frequency-modulated output signal, wherein the desired carrier frequency of the second carrier is adjustable within a wide frequency range;
wherein an amplitude modulation occurs upstream of the vectorial converting during an amplitude modulation of the frequency modulated signal with an amplitude modulation signal, and
wherein an amplitude modulation also occurs in I and Q branches between the vectorial converting and the IQ modulation.

2. The method according to claim 1, wherein each of the IQ signals is filtered through a low pass filter before the IQ modulation.

3. The method according to claim 2, wherein one or more of the frequency-modulated signal and the IQ signals are amplitude modulated by an envelope curve.

4. The method according to claim 2, wherein each of the low-pass filters is configured to pass baseband components of the IQ signals.

5. The method according to claim 1, wherein one or more of the frequency-modulated signal and the IQ signals are amplitude modulated by an envelope curve.

6. The method according to claim 1, wherein the generation of the frequency-modulated signal comprises providing a linear frequency deviation over a wide frequency range centered at the arbitrary fixed carrier frequency of the first carrier.

7. The method according to claim 1, wherein the wide frequency range includes a range of approximately 1 GHz to 44 GHz.

8. An apparatus, comprising:
a frequency modulator configured to generate a frequency-modulated signal from an input signal, wherein the frequency modulated signal is with a first carrier of an arbitrary fixed carrier frequency and said carrier is generated using an RF generator operating at said arbitrary fixed carrier frequency;
a vectorial converter configured to vectorially convert the frequency-modulated signal into IQ signals;
an IQ demodulator configured to demodulate the frequency-modulated signal as part of the vectorial conversion, wherein the IQ demodulator is driven by the same RF generator, wherein circuit path of the frequency-modulated signal is separate from the circuit path from the RF generator to the IQ demodulator;
an IQ modulator configured to combine the IQ signals with a second carrier of a desired carrier frequency to form a frequency-modulated output signal, wherein the desired carrier frequency of the second carrier is adjustable within a wide frequency range;
an amplitude modulator, located upstream of the vectorial converter, configured to amplitude modulate the frequency-modulated signal with an amplitude modulation signal; and
an amplitude modulator, located in I and Q branches between the vectorial converter and the IQ modulator.

9. The apparatus according to claim 8, further comprising:
one or more low-pass filters, connected at an output of the vectorial converter, configured to filter out carrier frequency signal components.

10. The apparatus according to claim 9, wherein each of the low-pass filters is configured to pass baseband components of the IQ signals.

11. The apparatus according to claim 8, wherein the frequency modulator is further configured to provide a linear frequency deviation over a wide frequency range centered at the arbitrary fixed carrier frequency of the first carrier.

12. The apparatus according to claim 8, wherein the wide frequency range includes a range of approximately 1 GHz to 44 GHz.

13. The method or apparatus according to claim 1 or 8, respectively, wherein said frequency modulator is realized using purely analog circuit elements.

14. The apparatus according to claim 13, wherein said RF generator, IQ demodulator, vectorial converter, and IQ modulator are realized using purely analog circuit elements.

15. The method or apparatus according to claim 1 or 8, wherein said input signal is a wideband analog signal.

* * * * *